United States Patent
Shen

[19]

[11] Patent Number: 5,871,396
[45] Date of Patent: Feb. 16, 1999

[54] CONVECTION TYPE HEAT DISSIPATION DEVICE FOR COMPUTERS THAT IS ADJUSTABLE WITH RESPECT TO A HEAT SOURCE

[76] Inventor: Tsan Jung Shen, 3F,No.52,Lane 280,Min Chin East Rd., Sec.6, Taipei, Taiwan

[21] Appl. No.: 909,091

[22] Filed: Aug. 12, 1997

[51] Int. Cl.$^6$ .................................................. H05K 7/20
[52] U.S. Cl. ......................................... 454/184; 361/695
[58] Field of Search ........................... 454/184; 361/695, 361/696, 697

[56] References Cited

U.S. PATENT DOCUMENTS

| 5,207,613 | 5/1993 | Ferchau et al. | 454/184 |
| 5,287,009 | 2/1994 | Heung | 361/695 X |
| 5,566,377 | 10/1996 | Lee | 361/695 |

FOREIGN PATENT DOCUMENTS

| 2235564 | 1/1974 | Germany | 454/184 |
| 3-268483 | 11/1991 | Japan | 361/695 |
| 1119273 | 7/1968 | United Kingdom | 361/695 |

OTHER PUBLICATIONS

D. C. Doig et al., Intermodular Cooling, IBM Technical Disclosure Bulletin, vol. 18, No. 8, Jan. 1976.

*Primary Examiner*—Harold Joyce
*Attorney, Agent, or Firm*—Bacon & Thomas, PLLC

[57] ABSTRACT

A convection type heat dissipation device for computers that is adjustable with respect to a heat source including a frame disposed inside the computer mainframe, the frame is connected to at least one movable tube fittingly provided on a guide duct. In use, it is only necessary to adjust the angle of an orifice portion at one side of the movable tube so that the orifice portion faces the heat source (e.g., the location of the central processing unit) within the computer mainframe. By actuating an air ventilation device located at the orifice portion, the heat generated within the computer mainframe can be quickly dissipated. Besides, the cooler ambient air may be drawn into the computer mainframe. By means of the arrangement of convection of air currents within the computer mainframe, the central processing unit and the other components of the computer may operate in a relatively low temperature and stable environment.

8 Claims, 3 Drawing Sheets

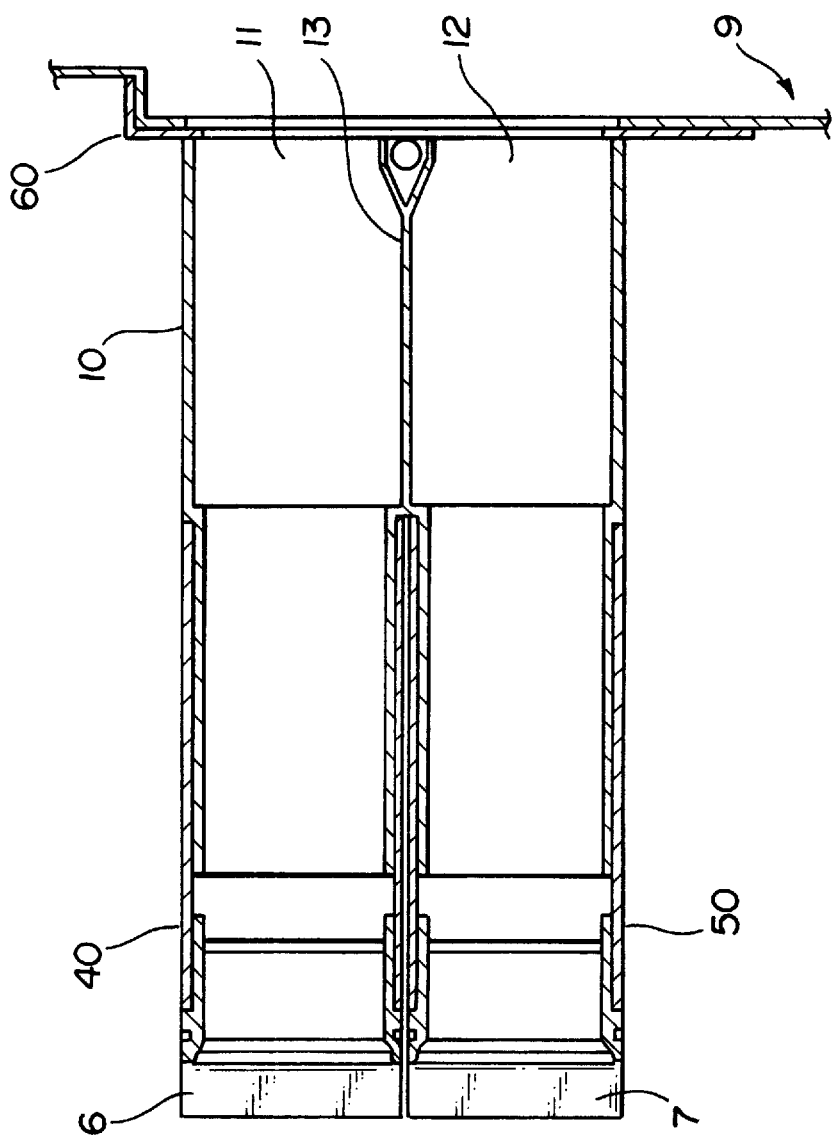

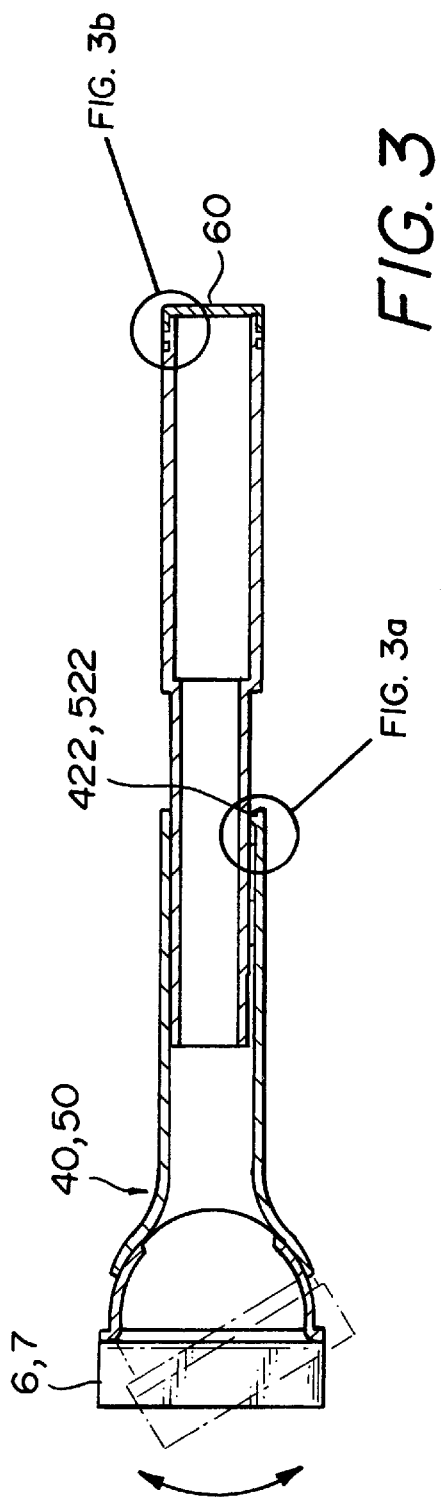
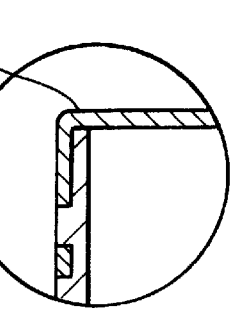
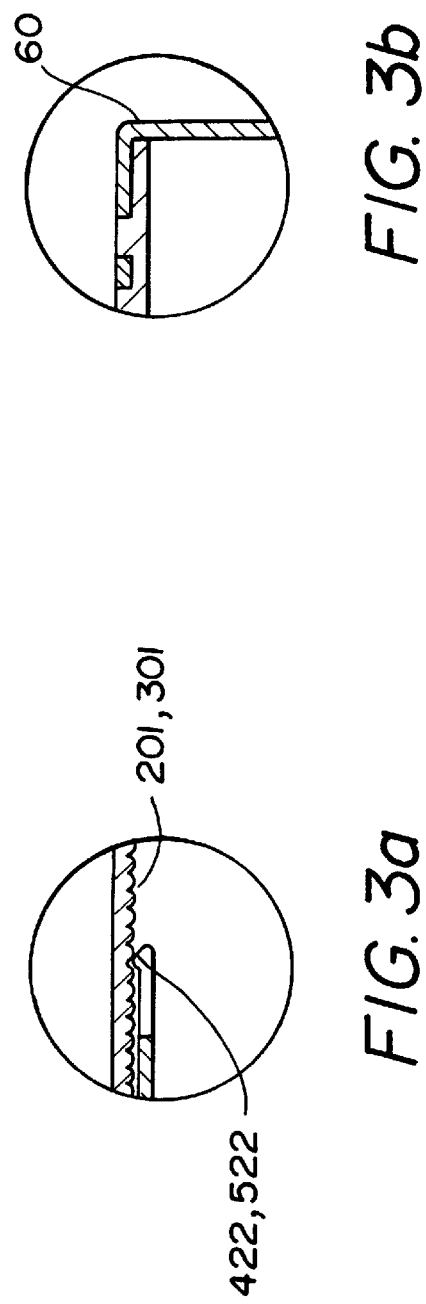

CONVECTION TYPE HEAT DISSIPATION DEVICE FOR COMPUTERS THAT IS ADJUSTABLE WITH RESPECT TO A HEAT SOURCE

BACKGROUND OF THE INVENTION (a) Field of the Invention

The present invention relates generally to a heat dissipation device for computers, and more particularly to a convection type heat dissipation device that is adjustable with respect to a heat source so as to provide enhanced heat dissipation effects.

(b) Description of the Prior Art

As the processing speed of today's central processing units is quite high, when a central processing unit operates under a fully loaded state, its surface temperature may reach as high as over 100° C.

Therefore, central processing units are generally equipped with cooling fans or coolers for dissipating the heat generated thereby during operation, so as to prevent the central processing unit from getting overheated, which may cause the system to become unstable or even break down.

According to the method of dissipating heat using cooling fans, the blades of the fan rotate to generate an air current which carries away with it the heat produced by the central processing unit. With conventional coolers, the cooler is fastened to the surface of the central processing unit and is made of material that may dissipate heat readily. The cooler is further provided with a plurality of blades or vanes so that it may help dissipate the heat of a larger area and effectively reduce the surface temperature of the central processing unit.

However, no matter whether cooling fans or coolers are used to help dissipate the surface heat of the central processing units, the heat dissipation efficiency is still not satisfactory. The major reasons are:

1. As the central processing unit is accommodated within an almost completely enclosed computer mainframe, the heat generated thereby cannot be continuously and effectively carried to the outside from the enclosed housing by utilizing the conventional heat dissipating devices as described above. The longer the period the central processing unit operates, the worse the effects of heat convection within the housing, resulting in low heat dissipation efficiency.
2. In view of the present trend to compactize computers, the space available within the housing for accommodating the mother board will become smaller and smaller. Therefore, the dissipation of heat generated by the central processing unit becomes more a problem, and heat dissipation becomes more difficult with more compact systems.
3. From the viewpoint of the present day technology development, if it is desired to raise the number of bytes processable by the central processing unit or to increase the processing speed, how to enable the central processing unit to dissipate its heat more speedily is a major concern.

SUMMARY OF THE INVENTION

Accordingly, a primary object of the present invention is to provide a convection type heat dissipation device for computers that is adjustable with respect to a heat source, wherein the heat generated by the central processing unit or other components inside the computer during operation may be quickly discharged, and cooler ambient air may be drawn into the computer mainframe. A convection of air currents is thus created within the computer mainframe, which will ensure that the temperature of the computer system will remain relatively low and eliminate the problem of overheating of the computer components.

Another object of the present invention is to provide a convection type heat dissipation device for computers that is adjustable with respect to a heat source, wherein the temperature of the central processing unit may be maintained at a stable level, making upgrading of central processing unit possible.

A further object of the present invention is to provide an insert body which is engageable with a convection type heat dissipation device for computers, wherein the insert body may be inserted into an insert slot of the computer mother board to ensure that the heat dissipation device is firmly mounted on the computer mainframe.

BRIEF DESCRIPTION OF THE DRAWINGS

The foregoing and other features and advantages of the present invention will be more clearly understood from the following detailed description and the accompanying drawings, in which, FIG. 2 is a schematic sectional view of the present invention; and FIG. 3, 3A and 3B are other schematic sectional views of the present invention.

DETAILED DESCRIPTION OF THE PREFERRED EMBODIMENT

Figure 1:
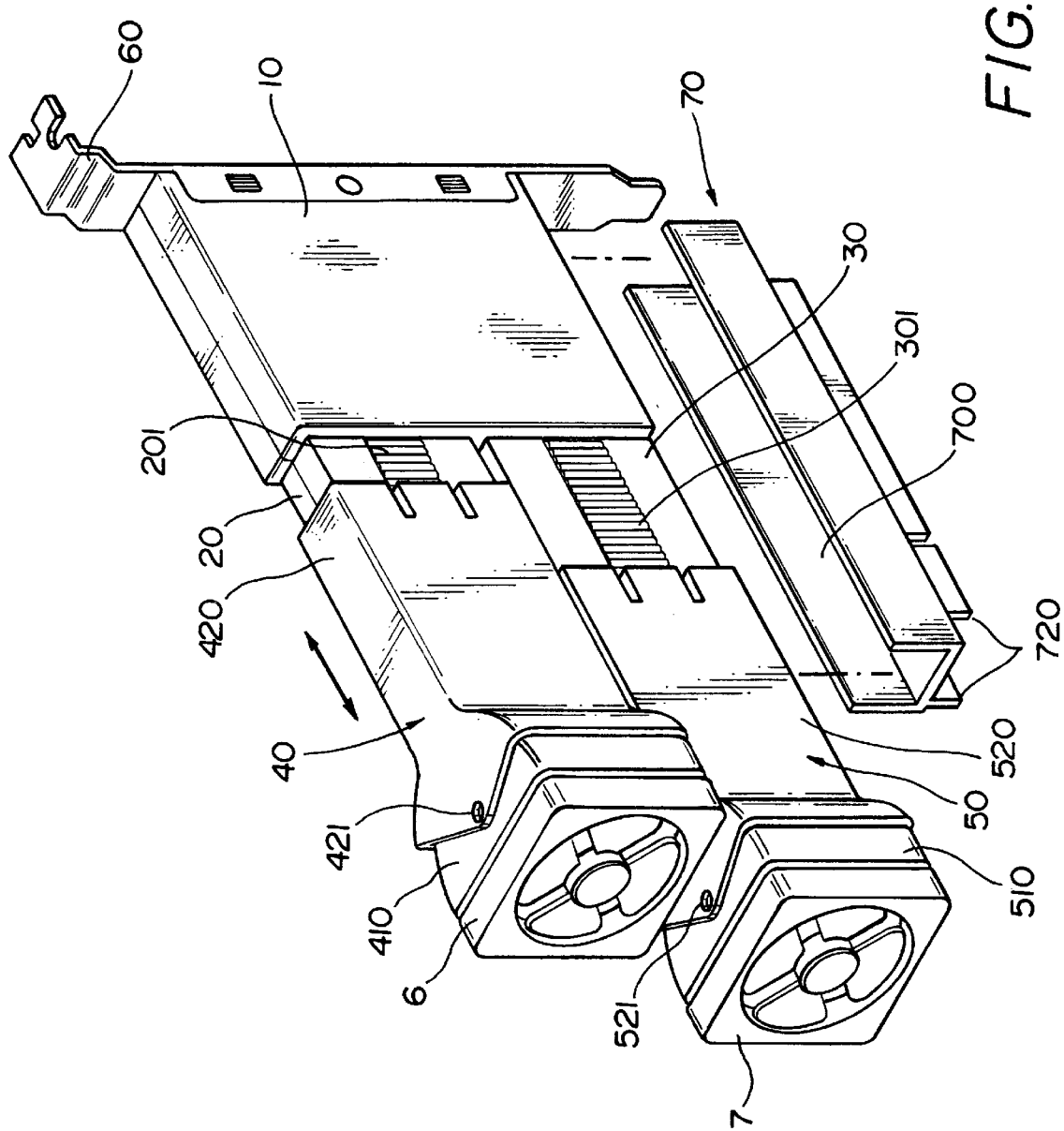
FIG. 1 is a perspective view of a preferred embodiment of the present invention.

With reference to FIG. 1, the present invention is directed to a convection type heat dissipation device for computers that may allow adjustment of the angle of hot air discharge according to the position of a heat source. The invention essentially comprises a frame 10 which is internally provided with a partition plate 13 (see FIG. 2). The partition plate 13 defines a first passage 11 and a second passage 12 corresponding to an upper part and a lower part of a computer mainframe (not shown). The hot air currents inside the computer mainframe may be guided out of the housing via the first passage 11, or the cool ambient air may be guided into the computer mainframe via the second passage 12. Furthermore, one end of the frame 10 is connected to an insert plate 60, by means of which the frame 10 may be lockably connected to a housing 9 (see FIG. 2) of the computer mainframe.

Referring to FIG. 2, that end of the partition plate 13 which is adjacent to the housing 9 at one end of the first passage 11 forms an upwardly extending structure, by means of which the hot air current inside the computer mainframe may be guided along an upward path to the outside. Furthermore, that end of the partition plate 13 which is adjacent to the housing 9 at one end of the second passage 12 forms a downwardly extending structure, by means of which the cooler ambient air may flow into the computer mainframe via a path different from that of the hot air current.

Referring back to FIG. 1, the frame 10 is provided with a first guide duct 20 and a second guide duct 30 at the other ends of the first passage 11 and the second passage 12 respectively. The first guide duct 20 and the second guide duct 30 are respectively provided with a plurality of juxtaposed insert grooves 201, 301 at one side thereof.

Furthermore, those ends of the first guide duct 20 and the second guide duct 30 which are distal to the frame 10 are respectively fitted with a first movable tube 40 and a second movable tube 50. The first movable tube 40 and the second movable tube 50 are both comprised of an orifice portion 410 (510) substantially in the shape of a funnel, and a tube body 420 (52) pivotally joined to the orifice portion 410 (510). The orifice portions 410, 510 are each provided with a pivot hole (not shown), and the tube bodies 420, 520 are each provided with a mounting hole corresponding to the pivot holes of the orifice portions 410, 510, so that the orifice portions 410, 510 and the tube bodies 420, 520 may be pivotally joined by pivots 421, 521 passing through the pivot holes and mounting holes. Furthermore, the orifice portions 410, 510 may be provided with respective air ventilation devices (such as an exhaust fan 6 disposed at the first movable tube 40 and an induction fan 7 disposed at the second movable tube 50).

The tube bodies 420, 520 of the movable tubes 40, 50 are respectively sleeved onto the first guide duct 20 an the second guide duct 30. Besides, the tube bodies 420, 520 are respectively provided with hooks 422, 522 (see FIG. 3A) for matching the insert grooves 201, 301 of the first guide duct 20 and the second guide duct 30. When the first movable tube 40 and the second movable tube 50 may retract or extend with respect to the first guide duct 20 and the second guide duct 30, and when the first movable tube 40 and the second movable tube 50 has accomplished extension or retraction with respect to the first guide duct 20 and the second guide duct 30, the hooks 422, 522 will engage and retain the corresponding insert grooves 201, 301.

Referring back to FIG. 1 again, in order that the device of the present invention may be securely mounted within the computer mainframe, one side of the frame 10 is provided with an insert body 70. The insert body 70 is provided with a groove 700 engageable with one side of the frame 10, and an outer bottom side of the groove 700 is provided with an insert portion 720 that may match an insert slot (such as an ISA insert slot or a PCI insert slot) of various specifications of computer mother boards.

In actual use, that side of the insert body 70 with the groove 700 is insertably provided at one side of the frame 10. Then the insert portion 720 of the insert body 70 is inserted into an ISA insert slot or a PCI insert slot of the computer mother board. Next the insert plate 60 is locked with the computer housing 9. Finally, the exhaust fan 6 and the induction fan 7 are actuated.

With reference to FIG. 1, after the exhaust fan 6 and the induction fan 7 are actuated, the exhaust fan 6 will blow the hot air generated inside the computer mainframe via the first movable tube 40 and the first guide duct 30, and out through the first passage 11 of the frame 10 to the outside.

On the other hand, the induction fan 7 will induce the cool ambient air into the computer mainframe via the second passage 12 of the frame 10, the second guide duct 30, and the second movable tube 50. In this manner, the hot air is guided out at the upper side of the device of the invention, and the path of the cool air is disposed below the hot air path, thus creating a good convection effect.

Furthermore, since the orifice portions 410, 510 are pivotally connected to the tube bodies 420, 520, if the spot of higher temperature within the computer mainframe (e.g., at the central processing unit) is not aligned with the orifice portion 410, 510, the orifice portions 410, 510 may be turned so that they face the heat source directly, thereby enhancing heat conductivity. Moreover, the first movable tube 40 and the second movable tube 50 may displace relative to the first guide duct 20 and the second guide duct 30 to thereby adjust the distance between the heat source and the orifice portions 410, 510 and enhance the heat dissipation efficiency. Hence, the temperature within the computer mainframe may remain relatively low and stable.

Although the present invention has been illustrated and described with reference to the preferred embodiment thereof, it should be understood that it is in no way limited to the details of such embodiment but is capable of numerous modifications within the scope of the appended claims.

What is claimed is:

1. A convection type heat dissipation device for computers that is adjustable with respect to a heat source, said device comprising:

a frame, said frame having at least two passages, one side of said frame being provided with an insert plate connectable with a housing of a computer mainframe;

at least one guide duct, said at least one guide duct being connected with one of said at least two passages of said frame;

at least one movable tube, said at least one movable tube being movably and fittingly provided on said at least one guide duct and being provided with at least one orifice portion capable of rotation relative to a tube body of said at least one movable tube;

at least one air ventilation device, disposed at said at least one orifice portion of said at least one movable tube; whereby after assembly and said at least one air ventilation device has been actuated, the hot air generated within the computer may be dissipated out of the computer via said at least one movable tube, said at least one guide duct, and one of said at least two passages of said frame, or the cool ambient air may be drawn into the computer via said at least one movable tube, said at least one guide duct, and one of said at least two passages of said frame.

2. A convection type heat dissipation device as claimed in claim 1, wherein one side of said at least one guide duct is provided with a plurality of juxtaposed insert grooves, and said at least one movable tube is provided with hooks matching said insert grooves of said at least one guide duct, such that said hooks may engage said insert grooves.

3. A convection type heat dissipation device as claimed in claim 1, wherein said frame is provided with two passages at locations corresponding to an upper part and a lower part of the computer mainframe, said two passages being respectively connected to two guide ducts, which are in turn fittingly connected to two movable tubes respectively, wherein an upper one of said two movable tubes that is connected to an upper one of said two passages corresponding to the upper part of the computer mainframe is provided with an exhaust fan, while a lower one of said two movable tubes that is connected to a lower one of said two passages corresponding to the lower part of the computer mainframe is provided with an induction fan, such that the hot air inside the computer mainframe may be discharged via said upper one of said two passages, whereas the cool ambient air may be induced via the lower one of said two passages, thereby creating a natural convection of air currents within the computer mainframe, which air currents may not interfere with each other.

4. A convection type heat dissipation device as claimed in claim 1 or 3, further comprising an insert body having one side insertably coupled to one side of said heat dissipation device, with the other side insertable into an insert slot of the computer mainframe.

5. A convection type heat dissipation device as claimed in claim 1, wherein said air ventilation device may be an exhaust fan.

6. A convection type heat dissipation device as claimed in claim 1, wherein said air ventilation device may be an induction fan.

7. A convection type heat dissipation device as claimed in claim 4, wherein said insert slot of the computer mainframe is an ISA insert slot.

8. A convection type heat dissipation device as claimed in claim 4, wherein said insert slot of the computer mainframe is a PCI insert slot.

* * * * *